US006392349B1

(12) United States Patent
Crenshaw

(10) Patent No.: US 6,392,349 B1
(45) Date of Patent: May 21, 2002

(54) REMOTE CONTROL TEST APPARATUS

(76) Inventor: David B. Crenshaw, 7346 Old Dominion Ct., Memphis, TN (US) 38125

( * ) Notice: Subject to any disclaimer, the term of this patent is extended or adjusted under 35 U.S.C. 154(b) by 0 days.

(21) Appl. No.: 09/428,898

(22) Filed: Oct. 28, 1999

Related U.S. Application Data
(60) Provisional application No. 60/106,470, filed on Oct. 30, 1998.

(51) Int. Cl.[7] .......................... F21V 19/04; H05B 37/02
(52) U.S. Cl. .......................... 315/86; 315/150; 362/276
(58) Field of Search .......................... 315/86, 149–159, 315/224, 360, 362; 362/205, 276, 183, 802

(56) References Cited

U.S. PATENT DOCUMENTS

| | | | | |
|---|---|---|---|---|
| 4,085,353 A | * | 4/1978 | Adams, Jr. et al. | 315/151 |
| 5,154,504 A | * | 10/1992 | Helal et al. | 315/86 |
| 5,336,977 A | * | 8/1994 | Li | 315/159 |
| 5,455,487 A | * | 10/1995 | Mix et al. | 315/150 |
| 5,455,488 A | * | 10/1995 | Rhoades et al. | 315/159 |
| 5,646,486 A | * | 7/1997 | Edwards et al. | 315/86 |
| 5,666,029 A | | 9/1997 | McDonald | 315/86 |
| 5,811,938 A | | 9/1998 | Rodriquez | 315/86 |
| 6,120,165 A | * | 9/2000 | Shalvi | 315/149 |

* cited by examiner

*Primary Examiner*—Don Wong
*Assistant Examiner*—Wilson Lee
(74) *Attorney, Agent, or Firm*—Garvey, Smith, Nehrbass & Doody, LLC

(57) ABSTRACT

A remotely controlled test system for testing the ready status of a fluorescent type emergency lighting fixture providing a 30 second or a 90 minute test of the battery operated fluorescent lamp upon command. The transmitted control signal is an infrared beam containing a selected pulse-time code which the receiving circuit can reliably receive, recognize and process in an environment of high infrared noise typically produced by fluorescent lighting. Upon recognition and verification of the selected pulse-time code, the microcontroller disenables the charging circuit to the battery for supplying power to the fluorescent lamp in the emergency mode to cause the emergency circuit to sense an AC power failure whereby the lamp illuminates in the emergency mode for the selected test period. In preferred embodiments the detector for the infrared beam, the housing in which it is mounted in the fluorescent fixture, the cable connecting the detector to the microcontroller are all surrounded with an electrically conductive shielding which is grounded to the microcontroller.

13 Claims, 6 Drawing Sheets

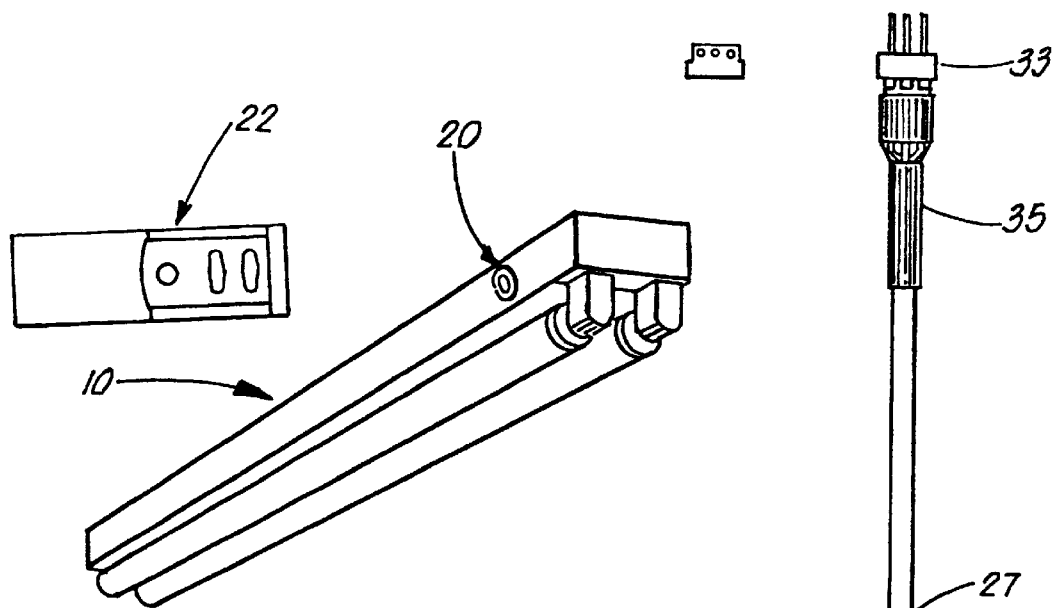
FIG. 4
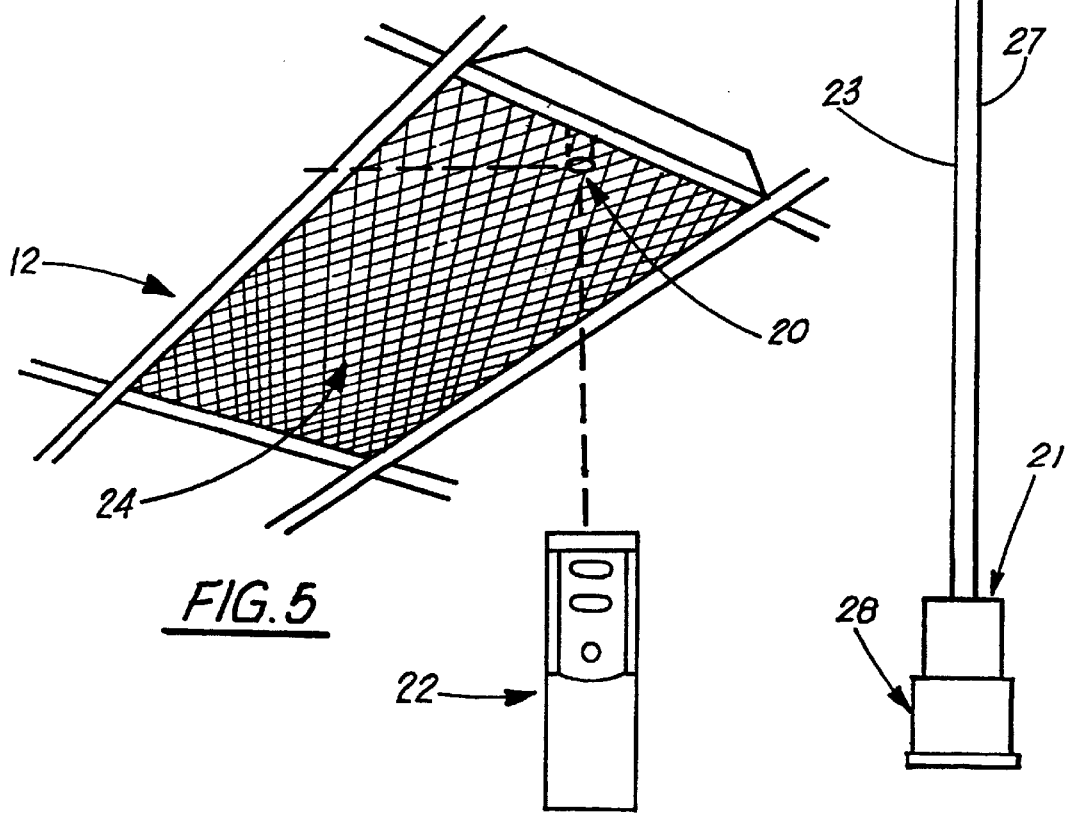
FIG. 5
FIG. 6

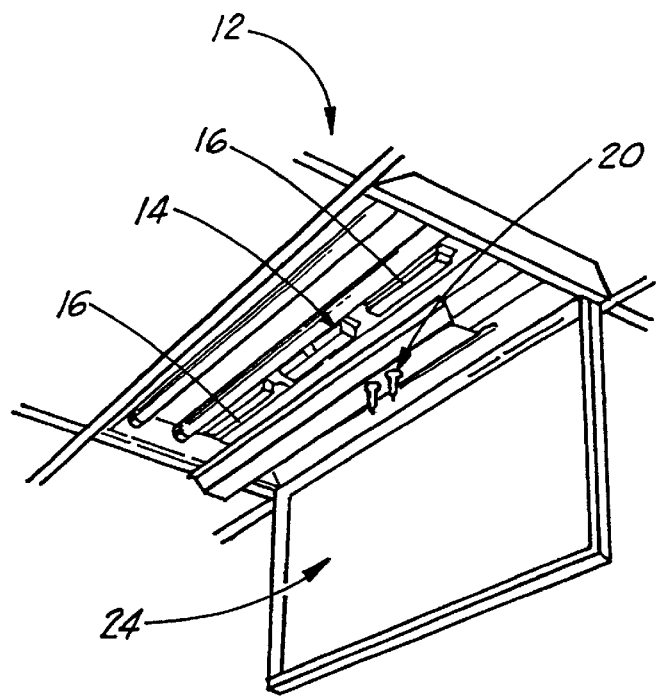
FIG. 7
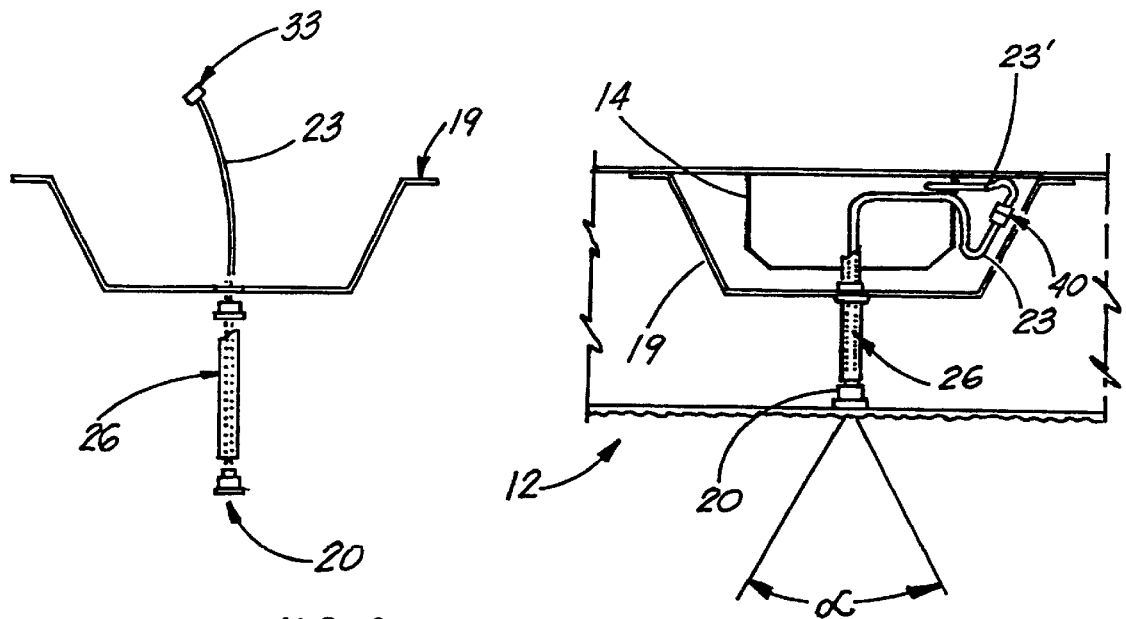
FIG. 8
FIG. 9

REMOTE CONTROL TEST APPARATUS

CROSS-REFERENCE TO RELATED APPLICATIONS

This application is based upon prior Provisional Application Ser. No. 60/106,470, filed Oct. 30, 1998.

STATEMENT REGARDING FEDERALLY SPONSORED RESEARCH OR DEVELOPMENT

Not Applicable

BACKGROUND OF THE INVENTION

1. Field of the Invention

The invention relates to emergency lighting, and particularly to fluorescent lighting wherein a ballast for a fluorescent lamp is connected to a source of electrical energy other than normal AC line current in the event that the normal AC current fails.

Emergency lighting is required in commercial, industrial, and institutional buildings just as fire extinguishers, smoke alarms and other safety equipment. Three types of emergency lighting are common in such installations: unit equipment, engine generators and central battery systems. Unit equipment falls into two principle types: fluorescent and incandescent.

The fluorescent units are customarily combined with and within a conventional fluorescent lighting unit by merely adding the emergency ballast consisting of a battery, a battery charger, inverter and sensing circuitry adjacent the standard fluorescent ballast. The sensing circuit observes the interruption of normal AC power to the lamp unit and immediately switches on the emergency ballast which powers the light fixture for the required period which, under most state safety codes, is a period of at least ninety (90) minutes, a standard called out in the National Electrical Code, NFPA Article 70, and NFPA Article 101 Life Safety Code. These regulations at NFPA, Article 101, Section 5–9.3 also mandate that periodic monitoring of the ready status of the emergency systems, including a 30 day test requiring 30 seconds of lighting and annual test requiring a 90 minute duration of lighting. An exception is provided for those emergency lighting units which contain a selftesting/self-diagnostic circuit which automatically performs a minimum 30 second test and diagnostic routine at least once every 30 days and indicates failures by a status indicator. U.S. Pat. No. 5,666,029 assigned to the assignee of the present invention is illustrative of such a self testing/self diagnostic circuit.

2. General Background of the Invention

U.S. Pat. No. 5,004,953 entitled Emergency Lighting Ballast for Compact Fluorescent Lamps with Integral Starters, assigned to the assignee of the present invention is illustrative of the fluorescent type of emergency lighting with a ballast. It is common in the installation of emergency fluorescent lighting that an emergency ballast is added to a conventional fluorescent fixture either in original installation or by retrofit. Alternatively, emergency lighting may be provided integrally in a unit having both internal regular and emergency ballasts installed. When main AC power to the lighting fails, voltage sensing circuitry instantly connects DC current from a battery (in the emergency ballast) to an inverter which produces high frequency, high voltage power to illuminate the emergency fluorescent lamp(s) for the required period.

The inclusion of test circuits for emergency fluorescent lighting is common, typically including the Test/Monitor panel, either mounted on a wall in the building, generally adjacent the emergency lamp, or on the case of the fluorescent ballast or fixture. The operation of these types of testing circuits requires the technician to go to the particular location of the test switch for each emergency fixture, which is somewhat time consuming. Such a configuration involves considerable installation cost in that the wall mounted test switch must be wired directly to each fixture to be tested. In the case of test switches located directly on a fixture, though avoiding the extra installation cost of the wall mounted switch, the technician then has to access each fixture individually to initiate the test. This procedure is time consuming since fixtures are often eight to twenty feet above the floor in commercial or industrial buildings.

U.S. Pat. No. 5,666,029 entitled Fluorescent Emergency Ballast Self Test Circuit, assigned to the assignee of the present invention is illustrative of a fluorescent emergency lighting ballast which includes an integral self test function. In the described ballast, the testing is a programmed function, carried out independently by the circuitry in the ballast and in the event of a malfunction in the test, a warning light and/or alarm sounds to advise of the test malfunction.

The present invention in its most common form involves the combination of the concept of a type of remote control as utilized with garage door openers, television and VCR machines which activates a specialized monitor circuit integrally connected into the emergency ballast for the fluorescent emergency lamp. With this remote control test feature, a technician performing the tests, whether the 30 second or the 90 minute variety, may conduct a survey of several emergency fixtures in a "point-click-test" series while making a tour through a facility, returning within the required time frame (30 seconds or 90 minutes) to observe that the lamp is still operating in the emergency mode and meeting the requirements of the Life Safety Code. In a preferred embodiment, the test unit includes a reset function to terminate any unwanted prior test activation. On reset, any prior test of the emergency ballast to emergency (i.e., battery) function is terminated and the lamp is reconnected to normal AC power, with the battery charging circuit also energized.

Prior attempts of providing fluorescent emergency lighting with such remote control operation have been unsuccessful. The significant amounts of infrared light (noise) produced by fluorescent lamps interferes with conventional remote control transmitters and receivers, to the degree that reliable, repeatable tests have not been possible. Further, the significant amount of infrared noise within the fluorescent fixture has prevented the mounting of a useful detector of the remote test control signal. The present invention breaks through the infrared noise barrier by using a uniquely coded signal which interrogates the fixture and if analyzed to be of a proper digital pulse train, and upon successful match, initiates the particular requested test sequence (30 second or 90 minute). The invention further provides a novel infrared detector housing further enhancing the receipt of the coded signal and novel cabling to connect the detector to the control circuit in the emergency ballast.

SUMMARY OF THE INVENTION

It is an object of the present invention to perform selective testing of an emergency ballast of a fluorescent luminaire.

A collateral object of the invention is to perform testing in the emergency ballast which closely simulates the emergency function of the luminaire, verifying that the emergency capacity of the luminaire is functional.

A further object of the invention is to provide for remote activation of the emergency test without having to activate a test switch located on the luminaire or at a discrete location.

These and other objects of the present invention are achieved by a lighting system including a luminaire including a fluorescent lamp, means for delivering main AC power to the lamp from an AC power source; a DC power source consisting of a stored energy supply; rectifier means for recharging the stored energy supply; inverter means connected to the stored energy supply for producing power from current provided by the DC power supply; supplying such power to the lamp when the mains AC power is interrupted and means for deactivating the inverter when main AC power is being supplied to the lamp; a remote infrared transmitter capable of emitting a coded signal for interrogating an emergency ballast test control; an infrared detector coupled to a microcontroller through a quick connect shielded cable to receive, examine and decode the coded signal, the microcontroller signaling the emergency ballast to supply power from the stored energy source by switching off the mains AC power upon recognition of the coded test signal.

DESCRIPTION OF THE DRAWINGS

FIG. 4 is a perspective view of a strip fluorescent fixture including the present invention.

FIG. 5 is a perspective view of a troffer fluorescent fixture including the present invention.

FIG. 6 is a top view of the cable assembly according to the present invention.

FIG. 7 is a perspective view of a troffer fixture with the lens open illustrating the present invention.

FIG. 8 is a partial sectional view of the mounting of the cable assembly of the present invention in a troffer fixture.

FIG. 9 is an additional partial sectional view of the mounting of the cable assembly of the present invention in a troffer fixture.

DETAILED DESCRIPTION OF THE PREFERRED EMBODIMENTS

Figure 1:
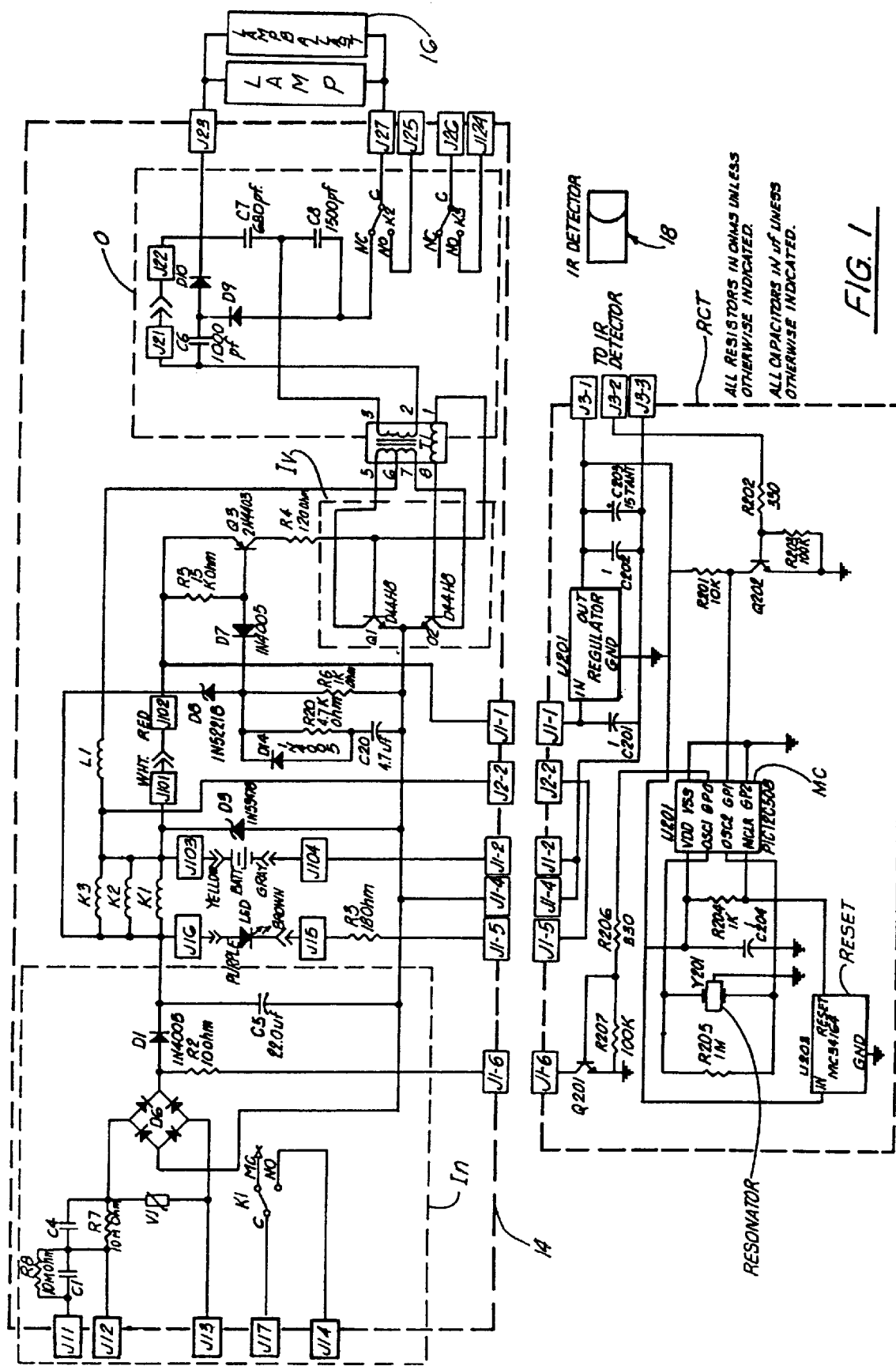
FIG. 1 is a circuit diagram of a preferred embodiment of the remote control test for fluorescent emergency lighting according to the present invention including the infrared initiated microcontroller circuit for activating a remote control test.

Referring now to FIGS. 1, 4, 5, 7 and 10, the invention is illustrated in the context of a conventional fluorescent lamp (whether a strip fixture 10 or a troffer fixture 12), including an emergency ballast 14 for standby lighting during a period when the main AC power fails. FIG. 1 illustrates the circuit diagram of a conventional emergency ballast which would be connected in parallel with a conventional fluorescent ballast 16 for providing emergency lighting the event of main AC power failure. In the FIG. 1, were the standard fluorescent ballast be shown, its output would be connected to lamp(s) LAMP, in parallel with the output of the emergency ballast EMERG. Relay contacts K2 and K3 operated by coils K2 and K3 are responsive to the battery BATT charging current and upon failure of the main AC power, failure of power to the battery charging circuit In, and thus K2 and K3, allows the switching of the relay contacts K2, K3, to shift the load of LAMP from the AC supply (via the standard ballast) to the emergency ballast EMERG. More particularly, as described below input/charging circuit In which provides charging current to the battery BATT and disables the emergency operation mode of the emergency ballast EMERG during the period that AC power is being supplied by main AC supply, as at J11 or J12 and J13. In preferred embodiments of emergency ballasts, inclusion of alternative voltage connections enable the system to be selectively connected to either standard commercial voltage AC (277 volts AC) or normal residential voltage (120 volts AC). Common, or ground potential connector J13 completes the connections to the system input.

The two voltage terminals and the common terminal are connected to the AC inputs of a full wave (preferably) rectifier D6, the high voltage input terminal being connected via capacitors C1 and C4 and resistors R8 and R7 to limit the charging current supplied to rectifier D6 to discharge the power from the capacitors after the power is removed from the circuits. The DC output from rectifier D6 is supplied to battery BATT via the coils of relays K1, K2 and K3. Similarly, the DC output of rectifier D6 is connected to a light emitting diode LED as an indicator that the battery BATT is in the charging mode.

Responsive to the status of input/charging circuit In, switch of relay, K2, which connects to terminal J27, to a normally open contact (NO) of relay, K2, when its coil is energized and to terminal J25, a normally closed contact (NC) of relay, K2 when its coil is de-energized, the latter position being that illustrated in FIG. 1. Relay K3 has a similar switch and associated set of contacts which are provided to connect load LAMP when the normal AC supply or auxiliary AC supply is powering the input/charging circuit In.

Battery BATT may be composed of, for example, a 6 volt (DC) nickel cadmium battery.

Alternate battery configurations are possible, dictated by the power requirements of load L. The output circuit O of the emergency ballast EMERG includes a transformer T1 having a primary winding P1 and a feedback winding F1 on the input side of transformer T1 and a secondary winding S1 on the output side. Output circuit O provides current limiting to the fluorescent lamp load L only to the degree that is necessary to keep the lamp within its operational limits. The output circuit O is composed of a capacitor, C5, connected across the output of the secondary winding, S1, of transformer T1. Capacitors C6 and C7 connected in parallel and generally in series with the fluorescent lamp L which the output circuit O powers during emergency operation.

In the emergency mode, power is supplied to load LAMP from the output circuit by battery BATT through the operation of inverter circuit Iv. Initially the operation of the inverter circuit Iv is placed in operation by transistor Q3 going into conduction enabling the oscillation of switching transistors Q1 and Q2, including a high voltage surge from the output circuit O for a short interval (which may be in the order of a few milliseconds) after AC power failure to permit the starting of the fluorescent lamp. Those familiar with fluorescent lighting will recognize that a short application of an initial voltage in the range of approximately 500 volts is required to initiate the ignition of the gasses in the standard fluorescent lamp. Immediately after ignition, as switch Q3 continues to supply base current to Q1 and Q2 as later discussed, the current regulating capacitors C8 and C7 in the output circuit O regulate the current level to that required to operate the fluorescent lamp at its emergency rated (reduced) illumination.

During normal operation when main AC power supply is functioning, charging current is supplied from the rectifier D6, to battery BATT, while energizing relays K1 and K2 so that the switch Q3 and the oscillating switches Q1 and Q2 and the output circuit O are inactive. Should the main AC power supply fail, and for that continuing period of time until normal main AC power resumes, such that its frequency and voltage output again power rectifier D6, relays K1 and K2 are de-energized so that the fluorescent lamp load is connected to the output circuit O and the inverter Iv is triggered into operation.

Remote Control Test Circuit (RCT) is connected to the emergency ballast EMERG through terminal J1-6, which is tied to the output of rectifier D6 at diode D1. In order to initiate a test of the function of the emergency ballast, the output on pin GPO of the RCT activates switch Q201 which sinks the current coming out of rectifier D6 through resistor R2 causing the battery charging circuit $I_N$ to sense a failure of main AC power. Then, according the description of the RCT circuit below, the emergency ballast EMERG cycles through a 30 second or a 90 minute test, as signaled by the RCT.

As illustrated in FIG. 1, RCT is driven by a microcontroller chip MC, such as the PIC12C508 from Microchip, Inc. which is utilized in the illustrated embodiment. As those skilled in the art will appreciate, the selection of a particular microprocessor is influenced by the functions to be performed, costs and compatibility with the other system components, and other microcontrollers might be selected, with some adjustment of other circuit components. RCT is powered by emergency ballast EMERG through contacts J11 from battery BATT which is provided to regulator U201 which provides a regulated 5 volt supply to the microcontroller chip MC and to an infrared detector ID, which is mounted on the face of a fluorescent fixture or, in the case of a ceiling mount with a translucent cover, on the face of the cover adjacent the fixture behind the cover (not shown). Infrared detector ID receives a coded signal (described later) from the remote transmitter which is supplied to the base of buffer Q202 which inverts and amplifies the received coded signal and inputs the signal to the microcontroller MC at pin GP1. Microcontroller is driven by resonator RES, which in the illustrated embodiment includes capacitors C206 and C205, R 205 and resonator Y201 which sets the clock frequency of microcontroller MC at 2 MHZ, a value coordinated to the signal received from infrared detector ID to be examined and processed by microcontroller MC. As observed previously, those skilled in the art should understand that the clock value might be varied should a different coded signal or other operating parameter be chosen.

As added reliability for the testing process available through the remote control test circuit RCT, a reset capability is supplied by a reset control RS including undervoltage sensing integrated circuit U203 (such as MC34164). Reset RS monitors the battery BATT voltage (the 5 volt output voltage of regulator U201) and is set to signal a supply voltage of less than 2.7 volts, selected as the lower limit of reliability for signal processing by microcontroller MC. On observation of a supply voltage of below 2.7 volts, reset RS provides an input to microcontroller MC pin MCLR which in the preferred embodiment illustrated disables the microcontroller MC. When reset RS observes that the supply voltage has returned (i.e., above 2.7 volts), it outputs a signal through resistor R204 to pin VDD to recycle or "wake up" the microcontroller MC such that any incoming signals from infrared detector ID may be again processed.

Figure 2:
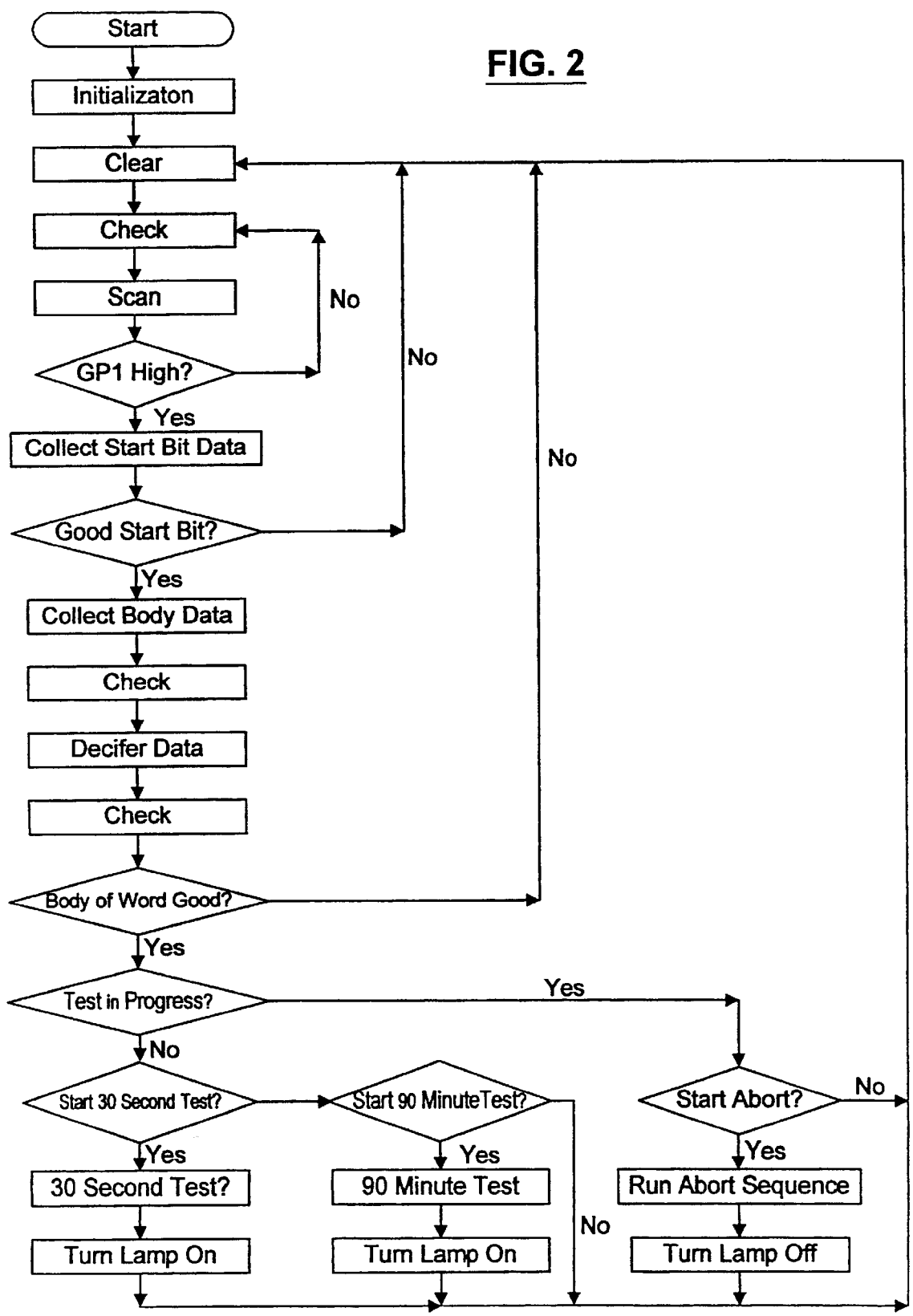
FIG. 2 is a flow chart illustrating the test procedure according to the present invention.
Figure 3:
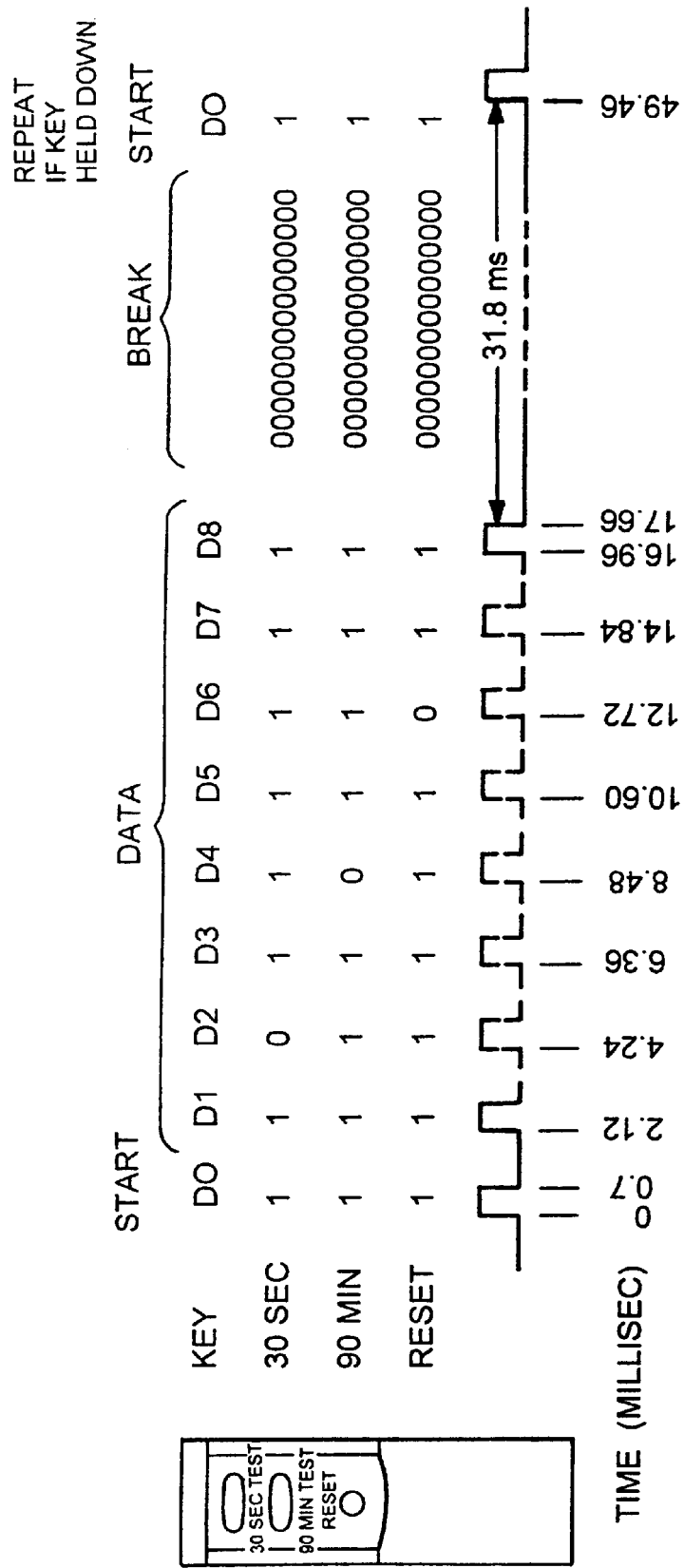
FIG. 3 is a diagram of the code signal transmitted by the remote control transmitter and received and processed by the microcontroller circuit in the present invention.
Figure 10:
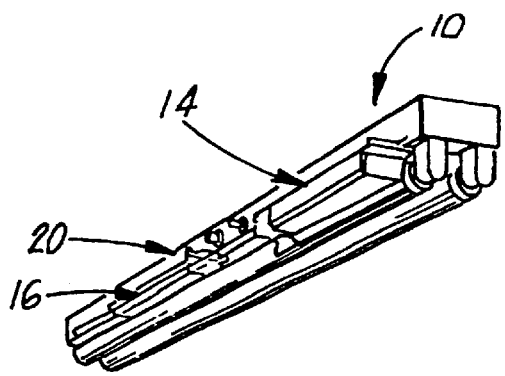
FIG. 10 is a pictorial view of a strip fluorescent fixture, partially cut away, illustrating the present invention.
Figure 12:
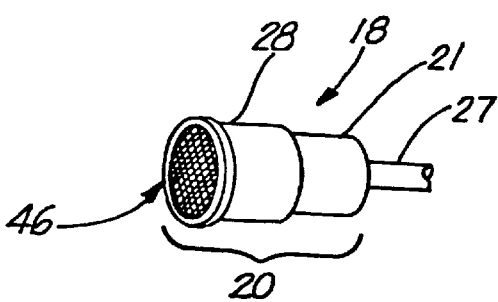
FIG. 12 is a pictorial of the detector housing of FIG. 11.
Figure 14:
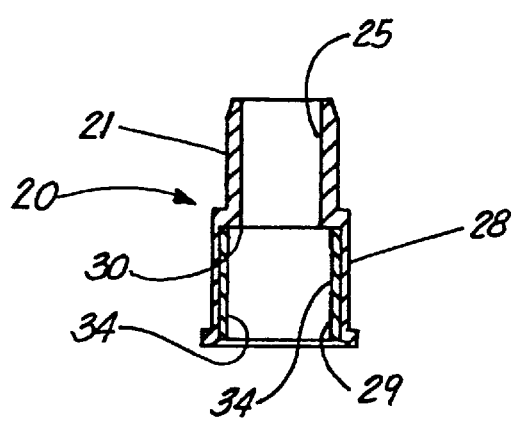
FIG. 14 is a sectional view of the detector housing of FIG. 13, taken on line AA.
Figure 13:
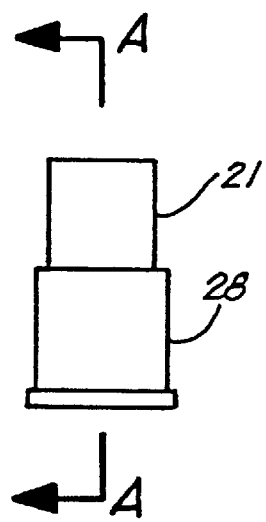
FIG. 13 is an elevational view of the detector housing of FIG. 11.
Figure 11:
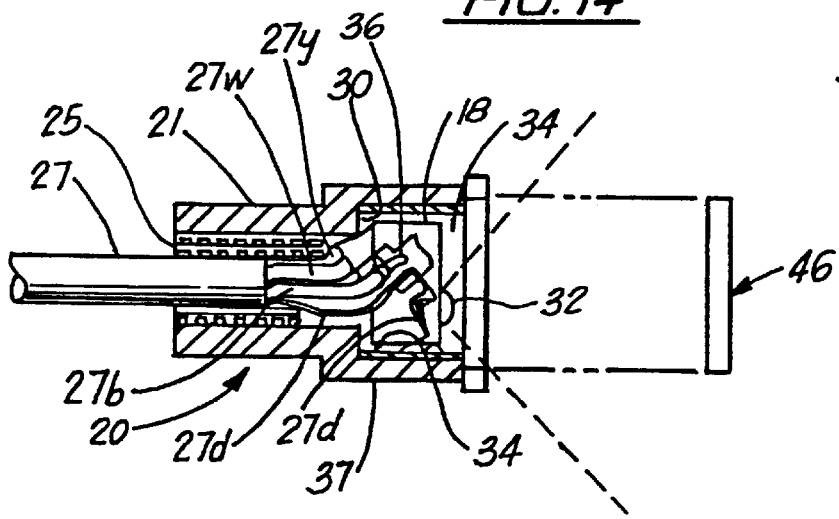
FIG. 11 is a sectional view of the detector housing according to the present invention.
Figure 15:
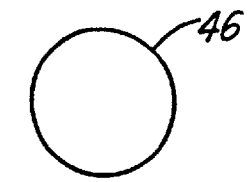
FIG. 15 is a plan view of the lens cover for the detector housing of FIG. 11.

FIG. 2 illustrates the interrogating signals transmitted by the hand-held remote (not shown) which are received by the infrared detector ID (20 in FIGS. 4, 5, 7, 8, 9, 10 and 11). The carrier frequency for the remote communications is centered at 319 THz, which is in the infrared spectrum ($\lambda$=950 nm). This carrier is amplitude modulated by a 38 KHz sub carrier in digital (on-off) pulses. This type of modulation is termed Amplitude Shift Keying modulation and significantly reduces the possibility of interference from other infrared sources, particularly the fluorescent lamps in close proximity to the testing process. The on-off digital pulses form a code modulation method of Pulse Code modulation (PCM) and the series of pulses convey the information respecting to the particular test to be performed. In the preferred embodiment illustrates, the signal incorporates a Pulse-Timing modulation (PTM) of a serial bit pulse train of nine bits, one start bit followed by eight data bits. These bits (again in this preferred embodiment) are 2.11 ms apart (at 473.9 Hz) with an "ON" pulse width of 0.817 ms, yielding a duty cycle of 38.7 percent. The 9-bit cycle is followed by a break, in the preferred embodiment of 31.6 ms. Accordingly, the entire signal (data plus break) is repeated every 49.27 ms as long as a selected transmit key on the hand-held remote is activated. It is significant to the reliability and repeatability of the inventive test that the complexity of both Pulse Code and Pulse Timing modulation are combined, the effect of which is to increase the signal-to-noise ratio of the interrogation to ensure accuracy and reliability of test. By using the described approach including a microcontroller in combination with the infrared detector to decode the test signal, the use of expensive and massive "matched filter" is otherwise avoided. Further, the use of the low frequency bit rate enables the signal to be checked for time "on" as well as time "off", along with the check of the bit pattern correctness, all without excessive demands on the decoding and thus reducing cost of the circuit. FIG. 3 illustrates three different signal lines, one for the 30 second test wherein the emergency ballast is signaled on for the 30 second period to assure operation of the fluorescent lamp in that period. The second signal line initiates the 90 minute test wherein the emergency ballast is controlled in the on condition for a period of 90 minutes to verify that the emergency lighting (and the battery capacity) will continue lighting in the emergency mode for that period. The third signal is to provide a reset of the system (and the emergency ballast) back to the regular operating condition wherein the lighting is powered by the main AC supply through the standard ballast, and the emergency ballast is in standby condition with its battery being charged. The reset signal is used primarily to terminate a running test, should that be desired. The microcontroller clock times each test and terminates the procedure at the end of the requisite time (i.e., 30 seconds or 90 minutes.) The hand-held remote control transmitter is analogous to the remote controls for television and video recorders, however wherein a preprogramed IC selectively transmits the signal pulse words illustrated in FIG. 3 according to the activation of the operating switches located on the hand-held control. The preferred hand-held control includes the capacity to selectively transmit one of the three pulse-time signals, each of which is dedicated to one of the three command functions of the hand-held remote: a) the 30 second test; b) the 90 minute test; and c) the reset signal. Similarly to the television remote, the transmitter is aimed at the detector ID (18 in FIGS. 4, 5) in the fluorescent fixture (10, 12 in FIGS. 4, 5), such that the selected infrared pulse train is beamed at the detector housing 20. Upon receipt of the signal, it is processed as described above.

The inventive signal code and timing together with the inventive elements described below enable the effective use of relative inexpensive, easily installed and used infrared signal interrogation and decoding within a high infrared noise environment and electromagnetic fields, thereby enabling the use of low cost infrared remote technology analogous to that used in TV's and VCR's, which otherwise would be unusable. The inventive detector housing 20 and shielded cable assembly 23 enable the more reliable use of the infrared signal code and timing in the noisy infrared environment. By way of general explanation of the interrogation process, prior to the full explanation of the flow diagram of FIG. 3, in the process of interrogation, the start bit is checked for a correct "ON" time and then checked for a correct "OFF" time. If this start bit is recognized as a correct bit, then the remaining eight bits are checked for the correct "ON" and "OFF" times, or are read and identified as one of the three signal train streams. Once the decoded pattern is verified as one of the three proper signals, the microcontroller looks for a second stream of bit information, to verify it as correct and a match of the first signal stream. Thus, the signal interrogation is checked for correctness in format based upon time, duty cycle and matching (twice) one of the three coded patterns. The inventive methodology provides sufficient signal-to-noise response to prevent false triggering of the test procedure by random infrared noise signals.

As illustrated in the flowchart of FIG. 2, on START, the microcontroller clock is cleared, ready for the start of the interrogation process. On INITIALIZATION the software in the microcontroller sets up the memory map and counters to prepare the sequence of functions to be performed by the controller. When the memory map and counters are installed, CLEAR sets the status register. CHECK is a verification that the microcontroller is set up and keeps up with time after which it SCANs the signal from the infrared detector ID to verify the receiving signal is at the required voltage level for processing; if it is (GP1 HIGH) the processing continues, if not, the microcontroller continues to examine incoming signals to look for one of the requisite voltage. With the recognition of a signal of sufficient voltage, COLLECT START BIT DATA receives the first data bit which in GOOD START BIT is checked for proper timing and width, and if the criteria are met (yes) the processing continues. If the start bit fails, the microcontroller resumes looking for a proper signal, clearing all stored signal memory at CLEAR. Once the suitable start bit is recognized, the microcontroller at COLLECT BODY DATA receives the remainder (8 bits) of the signal and examines the string to verify (CHECK) that eight additional bits were received. The microcontroller then in DECIFER does a more detailed review of the signal string to verify that the first bit is a true first bit (time and pulse width) and (CHECK) that there are eight correct following bits. If the CHECK is passed, BODY OF WORD GOOD is the second check on the following string of data bits to verify that the examined signal was repeated and matched. If this WORD is matched to one of the three words, the microprocessor then (on yes) proceeds to the test;, if not, the process goes back to the CLEAR, clearing out stored signal memory and looking again for a proper first bit. At TEST IN PROGRESS the microcontroller reads its activity to determine whether there is a test already ongoing; if so, the START ABORT function reads the word to see if it is the RESET signal, in which case the RUN ABORT SEQUENCE terminates the running test and sends the process back to the CLEAR function. With no test in progress, the particular bit word is examined to determine whether a 30 second or a ninety minute test is called for. On the particular recognition, either the 30 SECOND TEST or the 90 MINUTE TEST initiates the appropriate test sequence, including TURN LAMP ON for the requisite period and after the running of the program, or the abort sequence, the microcontroller returns to CLEAR for another signal.

Referring now generally to FIGS. 4 through 15, one important objective of the present invention is to allow the technician to aim the Remote Control Transmitter 22 (FIGS. 4 and 5) toward the lighting fixture 10, 12 and energize the test routine preferred. Because of safety requirements such as those-imposed for approval by Underwriters Laboratories, the detector and the wires connecting the infrared detector to the Remote Control Test Circuit (RCT in FIG. 1) must be placed totally within the fixture or, run through electrical conduit (which is costly, and would be cumbersome in installation). Therefore, placement of an infrared detector housing 20 must be behind the fixture lens 24 (troffer fixture 12 in FIGS. 5 and 7). It is well known to those skilled in the art relating to infrared remote controls such as for television and video recorders that fluorescent lighting generates significant infrared noise which interferes with the communication signals of infrared controllers. It is for this reason that infrared remote controllers are not utilized in close proximity to fluorescent lighting. There is an added complication in the present application since the detector is located behind fixture lens 24 (the function of which is to diffuse the fluorescent light generated) so the fixture lens 24 further diffuses the signal from the Remote Control Transmitter 22 before it is received by the detector 18 in detector housing 20 as well as reflecting some of the infrared noise generated by the fluorescent light back toward the detector 18. A further factor complicating the use of infrared detectors in such as fluorescent lighting is the electromagnetic fields generated by the high frequency electronic conventional 16 and emergency ballasts 14 which are in close proximity to a detector housing 20 mounted within a light fixture 10, 12. The present invention enables the use of infrared remote controllers in fields having a high degree of infrared noise, even when associated components generate electromagnetic fields, techniques previously avoided by those skilled in the art.

Referring now specifically to FIGS. 4 through 15, in addition to the use of a specially coded signal which is verified by a second signal train as discussed above, the present invention includes a novel detector housing 20 in which an infrared detector unit 18, such as a GP1U901X infrared detector from Sharp Electronics, Inc., is mounted. The preferred detector is compact in size to be conveniently located within the fluorescent fixture 10, 12. Detector 18 is mounted in a housing 20 which is also sized to be conveniently placed within a fluorescent fixture. In the preferred embodiment illustrated, detector housing 20 is comprised of two adjoining cylindrical sections, a collar section 21 and a detector section 28. Being adapted for mounting directly into standard fixtures as strip 10 and troffer 12, collar section is approximately ½ inch in diameter to fit a standard ½ inch electrical mounting tube 26 for the troffer mounting illustrated in FIG. 8 and 9. Tube 26 is retained in fixture 12 by means such as bracket 19 conveniently located near the end of fixture as illustrated in FIG. 5. For mounting in a strip fixture 10 having standard ⅝ inch holes, the detector section 28 has an outside diameter of approximately ⅝ inch. Housing 20 is manufactured of a convenient, light weight material such as PVC, either by fabrication or molding. Other materials, including metals might be substituted, depending upon cost of materials and manufacture.

The preferred detector 18 is capable of receiving the interrogating signals from the Remote Control Transmitter 22 and generating a comparable signal which is passed on to the remote control test circuit (RCT in FIG. 1) which is physically located in the emergency ballast 14. Detector 18 operates on the amplitude sift keying (ASK) code principle and incorporates a 38 kHz bandpass filter with high-gain amplifiers and an automatic gain control (AGC), parameters matching the interrogating signal from the Remote Control Transmitter 22. Contributing to the special effectiveness of the present invention is the configuration of the detector housing 20. As may be seen in FIGS. 12 through 15, housing 20 includes collar section 21 sized to conveniently receive cable 27 which connects detector 18 to the remote control test circuit RCT (FIG. 1). Cable 27 is preferably shielded to minimize electromagnetic induction from the fields established by the conventional and emergency ballasts. Further, cable 27 is sealed into the inside diameter 25 of collar 21 with potting 31, such as a silicon compound, for strain relief between the cable and collar section internal diameter 25. Detector 18 is mounted into the detector section 28 of housing 20, being affixed with a suitable adhesive to a mounting platform such as the off-set 30 between the different inside diameters 29, 25 of the collar section 21 and the detector section 28, respectively. Other techniques for mounting the detector 18 within housing 20 may be employed subject to location of the receiving eye 32 of detector 18 withing detector section 28 so as to have an angle of incidence $\alpha$ which shadows or blocks substantial amounts the surrounding detrimental infrared noise by limiting the reception of the eye 32 to a convenient cone within the angle $\alpha$. Those skilled in the art will appreciate that the angle of incidence $\alpha$ of receiving eye 32 is determined by the depth of eye 32 within the inside diameter 29 of An additional aspect of the present invention includes shielding 34 around the interior diameter 29 of the detector section 28. Shielding 34 is of an electrically conductive material, such as an adhesive backed copper tape such as produced by Minnesota Mining and Manufacturing, Ind. and available from electrical supply houses. Other shielding materials may be used so long as they are attachable to the interior diameter of detector section 28. In the present embodiment, shielding 34 is connected at terminal 36 to the ground wire 27d for cable 27 which is also shielded (not shown) and similarly connected to detector housing 20 at terminal 37 to protect against the electromagnetic field established by and in the vicinity of the electronic ballasts for the fluorescent lamps. In the preferred embodiment described, the Sharp GPIU901X is enclosed in a metal housing so that the detector 18 electronics are also shielded from the electromagnetic field of the ballasts. Since both housing 20 and cable 27 are shielded against the electromagnetic field interference, both may be mounted within the body of lighting fixtures 10, 12. Completing the assembly of detector housing 20 is the detector cover 46 which covers and protects the sensitive infrared detector 18 from dust or other airborne particles which may be present in a commercial or industrial environment. Detector cover 46 is preferably white so as to be relatively unnoticeable under fixture lens 24 when closed. Detector cover 46 is composed of a material which is translucent or transparent to the infrared signal from remote control 22, such as of a rigid vinyl or MYLAR, a polyester material available from E.I. duPont de Nemours & Company. Detector cover 46 material is selected to provide minimal attenuation of the infrared test initiating signal from Remote Control Transmitter since the less attenuation caused by detector cover 46 the greater will be the strength of the test initiating signal which must be received through the infrared noise by detector eye 32. Detector cover 46 is retained on detector section 28 by means such as an adhesive or other suitable attachment mechanism.

Completing the mounted assemblage for mounting a remote control test module including an infrared detector is cable assembly 23 including cable 27 being a three wire shielded cable such as Belden 9533 060 which is fitted at one end with a miniaturized, three prong plug-type connector 33 such as Berg 67954-002. It is preferable to enclose the connector 33 and attached (as by soldering or crimping) wires 27r, 27w, and 27b in such as stress relieving sleeve 35, (i.e, heat shrink tubing from SPC Technology PHS-024) to ensure reliable performance. Cable assembly 23 is terminated at its other end by detector housing 20 including detector 18. Cable wires 27r and 27w terminate on terminals 37t of detector 18 and carry the signal output of detector 18 responsive to Remote Control Transmitter 22 test signals to the remote control test circuit RCT (illustrated in FIG. 1). Wire 27b and the cable shield drain 27d are terminated on the casing of detector 18 at terminal 37 and drain 27d is also terminated on detector shield 34 at terminal 6 (all illustrated in FIG. 11). As with connector 33, the termination of wires 27r and 27w at detector 18 includes stress relieving sleeve 38, preferably of such as heat shrink tubing (e.g., 3M FP301). For ease of installation of the remote control test feature in the field, it is preferable to provide emergency ballast 14 with a complementary cable assemble 23' (to assembly 23) which is connected to the test circuit RCT (FIG. 1), and a cooperating female plug 33' (e.g., Berg 67954-00) to plug 33 so that the cables 23, 23' need only to be connected, as at connection 40 in FIG. 9.

In the illustrated embodiment, the following components have the values indicated:
C1 6.8 $\mu$Fd
C4 4.7 $\mu$Fd
C5 220 $\mu$Fd
C6 1000 pFd
C7 680 pFd
C8 1500 pFd
C20 4.7 $\mu$Fd
C201 0.1 $\mu$Fd.
C202 0.1 $\mu$Fd.
C203 15 $\mu$Fd. TANT
C204 0.1 $\mu$Fd.
Q1 NPN transistor D44H8
Q2 NPN transistor D44H8
Q3 PNP transistor 2N4403 PNP
Q201 NPN transistor ZTX851

Q202 NPN transistor ZTX851
U201 Regulator 5 V. TK11650
U202 Microcontroller PIC12C508
U203 Reset MC34164
Y201 2 MHZ resonator
R2 10 M ohns
R3 180 ohms
R4 120 ohms
R5 15 K ohms
R6 1 K ohms
R7 10 M ohms
R8 10 M ohms
R15 15 K ohms
R20 4.7 K ohms
D1 Diode 1N4005
D3 Zener 1N5347
D6 Bridge
D7 Diode 1N4005
D8 ZENER 1N5221B
D9 High Voltage Diode 2000 VDC, 50 mA, BYD43X2
D10 High Voltage Diode 2000 VDC, 50 mA, BYD43X2
D14 Diode 1N4005
K1, K2,K3 Relay SPDT 75 mA., 6 V.
T Transformer
   S1 500 turns, 34 ga.
   P1, 6 turns, center tapped, 23 ga.
   F1 2 turns, 23 ga
   Core ferrite plus
BATT Battery NiCd, SAFT, 6V, 4000 mAh
LED Indicator red
ID Infrared Detector Sharp GPIU901X
10 Strip fixture
12 Troffer fixture
14 Emergency ballast
16 Conventional ballast
18 Detector
19 Mounting bracket
20 Detector housing
22 Remote Control Transmitter
23 Cable assembly
23' Cable assembly
24 Fixture lens
25 Collar section inside diameter
26 Electrical mounting tube
27 Cable
27r red cable wire
27w White cable wire
27d Drain wire
28 Detector section
29 Detector section inside diameter
30 Off set
31 Potting
32 Detector eye
33 Cable plug
33' Cable plug
34 Detector shield
35 Stress relieving sleeve
36 Detector/drain terminal
37 Shield/drain connection
38 Stress relieving sleeve
40 Connection
46 Detector cover With the shielding offered by the described detector housing 20, the cable 23 and detector 18, all being grounded to the microcontroller RCT, the inventive signaling system may be utilized for other desirable control fimctions in an infrared/high EMI field environment, including functions as a switch for activating the standard fluorescent lamp.

The disclosed embodiments are to be considered in all respects as illustrative and not restrictive. Those skilled in the art will recognize that variations may be made in the interrogation signal word style, the sequencing, timing and phasing of the process as well as variations in the hardware for accomplishing the test function without departing form the spirit of the invention. The scope of the invention is to be defined by the appended claims rather than the foregoing descriptions and other embodiments which come into the meaning and range of equivalency of the claims are therefore intended to be included within the scope thereof.

What is claimed is:

1. A system for testing the ready status of a fluorescent emergency lighting fixture including a fluorescent lamp, a standard ballast powered by normal AC power for providing power the fluorescent lamp, an emergency ballast powered by a normal AC power for charging a battery to supply power to the fluorescent lamp when normal AC power is interrupted, wherein the system for testing the ready status of the emergency lighting fixture is remotely activated by a signal wherein the improvement comprises:
   a) a remote transmitter for sending a pulse-time coded infrared signal for initiating a test routine;
   b) an infrared detector mounted within the fluorescent emergency lighting fixture for receiving said pulse-time coded infrared signal; and
   c) a remotely controlled test circuit including a microcontroller connected to said infrared detector and to the emrgency ballast for the fluorescent lamp, said microcontroller being programmed to initiate said test routine upon recognition of the pulse-time coded infrared signal by providing an output to the emergency ballast simulating a failure of normal AC power;
   whereby upon actuation of the remote transmitter, the remotely controlled test circuit causes the emergency ballast for the fluorescent lamp to operate the fluorescent lamp according to the test routine.

2. The system for testing according to claim 1, wherein said remote transmitter is programmed to transmit and said microcontroller is programmed to provide an output resonsive only to a repeated selected pulse-time coded infrared signal.

3. The system for testing according to claim 1 wherein said microcontroller is programmed to provide an output responsive to a selected pulse time coded signal having a carrier frequency in the range of about 319 THz±five percent.

4. The system for testing according to claim 3 wherein the carrier frequency is modulated by a sub-carrier frequency of digital pulses in the range of about 38 KHz±five percent.

5. The system for testing according to claim 1 wherein said infrared detector is mounted in a shield housing disposed in the lighting fixture and the shielding of said housing is electrically connected to said microcontroller means.

6. The system for testing according to claim 1 wherein said infrared detector is electrically connected to said microcontroller means by a shielded cable, and said cable shielding is electrically connected to said microcontroller means.

7. The system for testing according to claim 6 wherein said shielding of said shielded cable is electrically connected to said shielding of said shielded housing for said infrared detector.

8. The system for testing according to claim 7 wherein said infrared detector is adapted with a conductive case and said case is electrically connected to said shielding of said housing and said cable shielding.

9. The system for testing according to claim 1 wherein said infrared detector is mounted in the light fixture in an infrared detector housing comprising:

a) a substantially cylindrical shell having a central bore therethrough, a detector mounting section disposed within said central bore at one end of said shell;

b) a cable receiving section disposed within said central bore at the other end of said shell;

c) said detector being fixedly mounted in the central bore of said detector mounting section whereby said detector is positioned in a recessed relation to the open end of said central bore of said detector mounting section;

d) a cable for conveying the electrical output of said detector to said microcontroller circuit means, one end of said cable being closely received within the central bore of said cable receiving section of said detector housing and electrically connected to the output of said detector, said cable being electrically connected at the other end thereof to said microcontroller circuit means.

10. The system for testing according to claim 9 wherein said cable includes an electrically conductive shielding and said shielding is connected to a ground potential terminal on said microcontroller circuit means.

11. The system for testing according to claim 10 wherein said central bore of said detector mounting section is lined with an electrically conductive shielding and said shielding is electrically connected to a ground potential terminal on said microcontroller circuit means.

12. The system for testing according to claim 11 wherein said electrically conductive shielding of said cable is electrically connected to said detector mounting section shielding and said ground potential terminal.

13. The system for testing according to claim 12 wherein said infrared detector is adapted with a conductive case and said case is electrically connected to said shielding of said housing and said cable shielding and said ground potential terminal.

* * * * *